(12) United States Patent
Cao et al.

(10) Patent No.: US 12,368,446 B2
(45) Date of Patent: Jul. 22, 2025

(54) CLOCK SWITCHING METHOD AND APPARATUS, ELECTRONIC DEVICE, AND COMPUTER READABLE STORAGE MEDIUM

(71) Applicant: SANECHIPS TECHNOLOGY CO., LTD., Guangdong (CN)

(72) Inventors: Wen Cao, Guangdong (CN); Rui Pang, Guangdong (CN); Yanyan Zhao, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/573,158

(22) PCT Filed: Mar. 28, 2022

(86) PCT No.: PCT/CN2022/083325
§ 371 (c)(1),
(2) Date: Dec. 21, 2023

(87) PCT Pub. No.: WO2022/267591
PCT Pub. Date: Dec. 29, 2022

(65) Prior Publication Data
US 2024/0305305 A1    Sep. 12, 2024

(30) Foreign Application Priority Data
Jun. 21, 2021  (CN) .......................... 202110685669.9

(51) Int. Cl.
*H03L 7/099*     (2006.01)
*H03L 7/083*     (2006.01)
(52) U.S. Cl.
CPC ............ *H03L 7/0992* (2013.01); *H03L 7/083* (2013.01)

(58) Field of Classification Search
CPC ... H03L 7/0992; H03L 7/083; H03L 2207/50; H03L 7/093; H03L 7/087; H03L 7/143;
(Continued)

(56) References Cited

U.S. PATENT DOCUMENTS 7,715,515 B2 *  5/2010  Olsson .................. H03L 7/0991
                                                            331/34
10,511,311 B1 * 12/2019  Tertinek .................... H03L 7/07
(Continued)

FOREIGN PATENT DOCUMENTS

CN       101079629 A     11/2007
CN       103004096 A      3/2013
(Continued)

OTHER PUBLICATIONS

WIPO, International Search Report issued on Jun. 8, 2022.
(Continued)

*Primary Examiner* — John W Poos
(74) *Attorney, Agent, or Firm* — Li & Cai Intellectual Property (USA) Office

(57) ABSTRACT

The present application provides a clock switching method, a clock switching apparatus, an electronic device, and a readable storage medium, the clock switching method includes: in a case where a first reference clock is determined to be in a locked state, determining an average control word according to a preset duration and an obtained real frequency tuning word; in a case where the first reference clock is determined to be in an invalid state, determining a compensation phase difference by using the average control word as a frequency control word of a digital phase locked loop; performing a phase compensation on a second reference clock according to the compensation phase difference (Continued)

to obtain an updated second reference clock; and switching the first reference clock to the updated second reference clock.

15 Claims, 8 Drawing Sheets

(58) Field of Classification Search
CPC . H03L 7/146; H03L 7/18; H03L 7/099; H03L 7/0991; H03L 7/085; H03L 2207/06; H03L 7/1976; H03L 7/091; H03L 7/0994; H03L 7/1075; H03L 7/0995; H03L 7/08; H03L 7/107; H03L 7/104; H03L 7/1974; H03L 7/16; H03L 7/0802; H03L 7/1806; H03L 7/113; H03L 1/00; H03L 7/081; H03L 7/095; H03L 7/12; H03L 7/0814; H03L 7/0805; H03L 7/06; H03L 7/183; H03L 7/197; H03L 7/07; H03L 7/0996; H03L 1/02; H03L 7/0807; H03L 7/089; H03L 7/0998; H03L 7/189; H03L 7/23; H03L 7/24; H03L 7/101; H03L 7/1072; H03L 7/22; H03L 1/022; H03L 1/025; H03L 7/0993; H03L 7/0997; H03L 7/187; H03L 3/00; H03L 5/00; H03L 7/0891; H03L 7/0898; H03L 7/10; H03L 7/141; H03L 7/191; H03L 7/00; H03L 7/14; H03L 7/1803; H03L 7/235; H03L 7/0816; H03L 7/0895; H03B 5/1228; H03B 5/1265; H03B 5/1212; H03B 5/1215; H03B 2201/0208; H03B 5/1218; H03B 5/04; H03B 5/124; H03B 5/1296; H03B 2201/025; H03B 2200/0072; H03B 1/00; H03B 5/1243; H03B 2200/005; H03B 2201/0266; H03B 5/1281; H03B 5/1293; H03B 5/12; H03B 5/1225; H03B 5/1253; H03B 2200/004; H03B 2201/0283; H03B 5/06; H03B 19/14; H03B 5/1206; H03B 5/1234; H03B 5/1268; H03B 5/1271; H03B 5/36; H03B 2200/0076; H03B 2200/0094; H03B 2201/011; H03B 28/00; H03B 5/08

See application file for complete search history.

(56) References Cited

U.S. PATENT DOCUMENTS

| | | | |
|---|---|---|---|
| 10,727,845 | B1 | 7/2020 | Balakrishnan et al. |
| 10,819,353 | B1* | 10/2020 | Monk ................. H03L 7/23 |
| 2011/0032013 | A1* | 2/2011 | Nelson ............... H03L 7/0994 |
| | | | 327/156 |
| 2019/0288699 | A1 | 9/2019 | Parekh |
| 2020/0076439 | A1 | 3/2020 | Weeks et al. |

FOREIGN PATENT DOCUMENTS

| | | | |
|---|---|---|---|
| CN | 103795408 | A | 5/2014 |
| CN | 111384948 | A | 7/2020 |
| JP | 2000286702 | A | 10/2000 |
| JP | 2017183958 | A | 10/2017 |

OTHER PUBLICATIONS

European Patnent Office, the extended European Search Report dated Sep. 19, 2024, for corresponding EP application No. 22827096.3.

Japan Patent Office, first Office Action dated Oct. 15, 2024, for corresponding JP application No. 2023-576167.

* cited by examiner

CLOCK SWITCHING METHOD AND APPARATUS, ELECTRONIC DEVICE, AND COMPUTER READABLE STORAGE MEDIUM

CROSS-REFERENCE TO RELATED APPLICATIONS

The present application claims priority to the Chinese Patent Application No. 202110685669.9 filed on Jun. 21, 2021, the entire contents of which are incorporated herein by reference.

TECHNICAL FIELD

The present disclosure relates to the field of communications technologies, and in particular, to a clock switching method, a clock switching apparatus, an electronic device, and a computer-readable storage medium.

BACKGROUND

With development of wireless communication systems, the number of channels for baseband and radio frequency devices is increasing, and correspondingly, a higher expectation is put forward on an operating clock of each channel. In order to effectively control the power consumption of the wireless communication system and improve the performance of the wireless communication system, the wireless communication system usually adjusts the operating clock according to different applications. For example, the wireless communication system often switches between two different clocks to ensure the accuracy of the operating clock.

However, during switching between different clocks, chip resources to be occupied are usually too much to easily cause a waste of the chip resources; moreover, in the related art, an analog circuit is adopted to perform a phase compensation between different clocks, which is not only difficult to be implemented, but also is prone to result in an error of the operating clock due to errors of data of the phase compensation.

SUMMARY

The present application provides a clock switching method, including: in a case where a first reference clock is determined to be in a locked state, determining an average control word according to a preset duration and an obtained real frequency tuning word; in a case where the first reference clock is determined to be in an invalid state, determining a compensation phase difference by using the average control word as a frequency control word of a digital phase locked loop; performing a phase compensation on a second reference clock according to the compensation phase difference to obtain the updated second reference clock; and switching the first reference clock to the updated second reference clock.

The present application provides a clock switching apparatus, including: a control word determining module configured to determine an average control word according to a preset duration and an obtained real frequency tuning word in a case where a first reference clock is determined to be in a locked state; a compensation phase determining module configured to determine a compensation phase difference by using the average control word as a frequency control word of a digital phase locked loop in a case where the first reference clock is determined to be in an invalid state; a phase compensation module configured to perform a phase compensation on a second reference clock according to the compensation phase difference to obtain the updated second reference clock; and a switching module configured to switch the first reference clock to the updated second reference clock.

The present application provides an electronic device, including: at least one processor; and a memory having at least one computer program stored thereon, the at least one computer program, executed by the at least one processor, causes the at least one processor to implement the clock switching method described in the present application.

The present application provides a computer-readable storage medium having a computer program stored thereon, the computer program, executed by a processor, causes the processor to implement the clock switching method described in the present application.

With respect to the above aspects and other aspects of the present application and implementations thereof, further description is provided in the description of accompanying drawings, detailed implementation and claims.

DETAIL DESCRIPTION OF EMBODIMENTS

In order to make purposes, technical solutions, and advantages of the present application clearer, implementations of the present application are described below with reference to the accompanying drawings. It should be noted that the implementations of the present application and characteristics in the implementations may be combined with each other if no conflict is incurred.

In order to guarantee the reliability of a communication system and prevent the degradation of performance of the communication system caused by a failure or a drift of frequency of a reference clock, two or more reference clocks are used as alternative clocks in the communication system. The communication system can perform clock switching between the reference clocks according to actual expectations, and priority levels and reliabilities of the reference clocks, so as to ensure that a bit error rate of a service link in the communication system is within a preset range. Furthermore, in telecommunication networks, in timing applications of communication systems and in applications of Ethernet synchronization, output clocks of clock generators are all expected to track an input reference clock with a relatively high accuracy.

Therefore, a clock generation chip is expected to have a function of automatically selecting an appropriate input reference clock, so as to enable the switching between a main operating clock and an alternative operating clock in the communication system as smooth as possible, and avoid a transient hop of the operating clock caused by switching between clocks. Moreover, the clock generation chip is further desired to meet expectations for a clock jitter in various operation modes.

Figure 1:
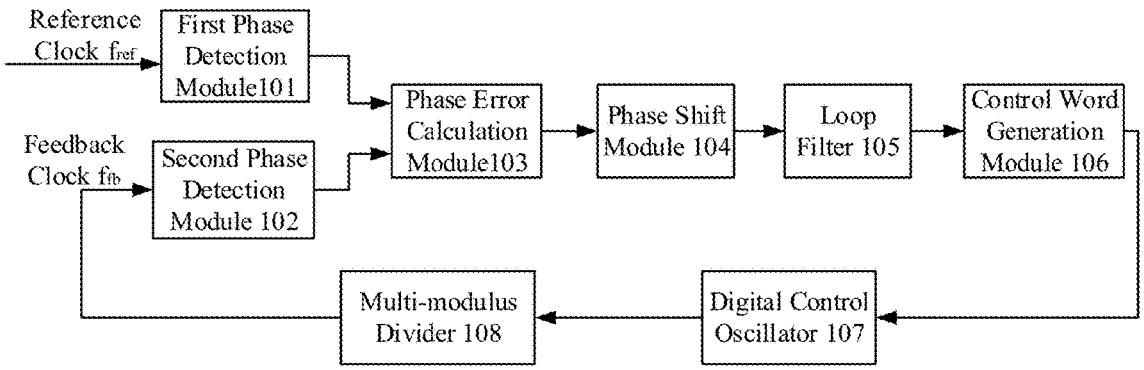
FIG. 1 illustrates a structural schematic diagram of a digital phase locked loop according to the present application.

FIG. 1 illustrates a structural schematic diagram of a digital phase locked loop according to the present application. As shown in FIG. 1, the digital phase locked loop includes a first phase detection module 101, a second phase detection module 102, a phase error calculation module 103, a phase shift module 104, a loop filter 105, a control word generation module 106, a digital control oscillator 107 and a multi-modulus divider 108.

The first phase detection module 101 is configured to measure a first phase of a reference clock $f_{ref}$, the second phase detection module 102 is configured to measure a second phase of a feedback clock $f_{fb}$, and then, the first phase and the second phase are input into the phase error calculation module 103 to determine a phase difference between the reference clock $f_{ref}$ and the feedback clock $f_{fb}$. Then, through a closed-loop feedback mechanism, the second phase of the feedback clock $f_{fb}$ is aligned with the first phase of the reference clock $f_{ref}$. The digital control oscillator 107 is controlled through the control word generation module 106, so that phases of an input clock and an output clock of the digital phase locked loop are kept in a tracking locked state. The phase shift module 104 is configured to adjust the phase difference between the reference clock $f_{ref}$ and the feedback clock $f_{fb}$, so that a phase of a clock output by the digital control oscillator 107 is adjustable.

Adopting the digital phase locked loop shown in FIG. 1, each reference clock is to be provided with one first phase detection module 101, a storage module is further to be adopted to store the first phase or the second phase measured by the first phase detection module 101 or the second phase detection module 102, and a Central Processing Unit (CPU) is to be adopted to calculate a phase difference between the first phase and the second phase, thereby resulting in a waste of chip resources; in addition, adopting the digital phase locked loop shown in FIG. 1, each reference clock is further to be provided with the phase shift module 104, if an analog circuit (e.g., an Analog Phase locked loop (APLL)) is used to implement a function of the phase shift module 104, it is not only difficult to implement, but also is prone to result in an error of an operating clock due to errors of data of a phase compensation.

Figure 2:
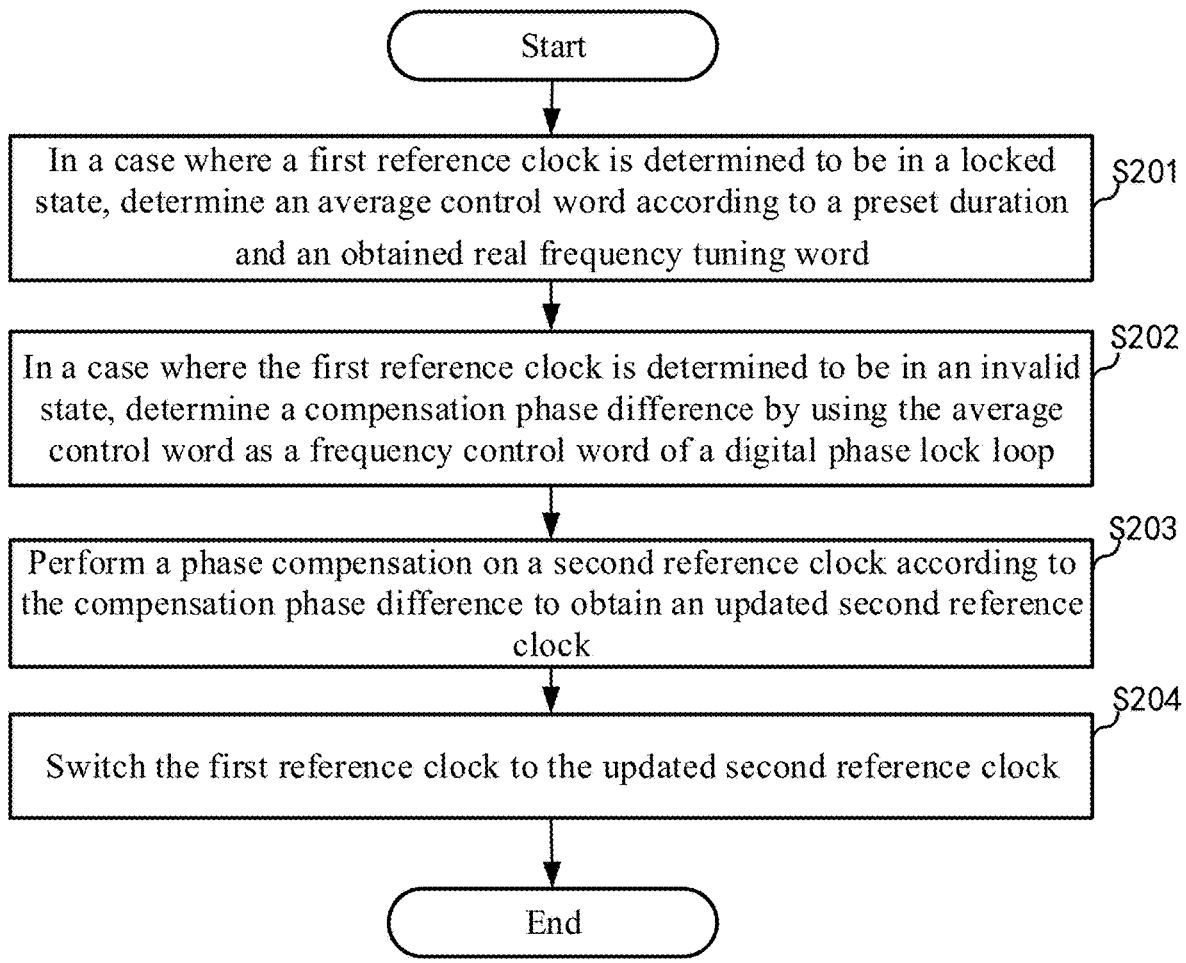
FIG. 2 illustrates a flowchart of a clock switching method according to the present application.

FIG. 2 illustrates a flowchart of a clock switching method according to the present application. The clock switching method may be applied to a clock switching apparatus arranged in a digital phase locked loop for seamlessly switching a reference clock. As shown in FIG. 2, the clock switching method provided in the present application may include following operations S201 to S204.

At operation S201, in a case where a first reference clock is determined to be in a locked state, determining an average control word according to a preset duration and an obtained real frequency tuning word.

The frequency tuning word (FTW) is a control word for adjusting a frequency of an oscillating circuit to enable the oscillating circuit to resonate with another oscillating circuit that is oscillating. In a process of adjusting the reference clock, a frequency corresponding to the reference clock may generate a damped oscillation, which may be reduced according to the average control word obtained by a long-term statistics on the real frequency tuning word.

It should be noted that stability of the average control word is proportional to the preset duration, for example, the longer the preset duration (e.g., 200 nanoseconds (ns), or 300 ns, etc.) is, the better the stability of the average control word is.

In some implementations, the determining an average control word according to a preset duration and an obtained real frequency tuning word includes: acquiring a plurality of real frequency tuning words within a range of the preset duration; and performing a long-term average operation on the plurality of real frequency tuning words according to the preset duration to obtain the average control word.

Each time may correspond to one real frequency tuning word, and by performing the long-term average operation on the plurality of the real frequency tuning words obtained within the range of the preset duration (for example, calculating a sum and an average of the real frequency tuning words) to obtain the average control word, the accuracy and the stability of the average control word can be ensured.

At operation S202, in a case where the first reference clock is determined to be in an invalid state, determining a compensation phase difference by using the average control word as a frequency control word of a digital phase locked loop.

An input signal of the digital phase locked loop is a digital signal converted by an analog device (e.g., a time digital converter), and an output signal of the digital phase locked loop may be a periodic pulse sequence which has an adjustable period and is controlled by an output signal of a digital filter.

By using the average control word as the frequency control word of the digital phase locked loop, the damped oscillation of frequency period of the reference clock during an adjustment process of adjusting the reference clock can be reduced, thereby reducing the jitter of an output clock, and the compensation phase difference obtained based on the average control word can be more accurate.

At operation S203, performing a phase compensation on a second reference clock according to the compensation phase difference to obtain the updated second reference clock.

The phase compensation is an operation of increasing or decreasing the phase of the second reference clock, based on the second reference clock, by using the compensating phase difference, so that the updated second reference clock is more accurate.

It should be noted that, since a phase difference exists between the second reference clock and the first reference clock, in order to make the second reference clock more accurate, the phase compensation is performed on the second reference clock according to the compensation phase difference, so as to align phases of the updated second reference clock and the first reference clock.

At operation S204, switching the first reference clock to the updated second reference clock.

Since the first reference clock is in the invalid state and cannot be used as the operating clock, and through above operations S201 to S204, the first reference clock is seamlessly switched to the updated second reference clock, so that the updated second reference clock can take over the first reference clock to be used as the operating clock to ensure the stability of the operating clock of the communication system.

In the present application, by determining the average control word according to the preset duration and the obtained real frequency tuning word in the case where the first reference clock is determined to be in the locked state, the damped oscillation of frequency period of the reference clock during the adjustment process of adjusting the reference clock can be reduced, thereby reducing the jitter of the reference clock; in the case where the first reference clock is determined to be in the invalid state, the compensation phase difference is determined by using the average control word as the frequency control word of the digital phase locked loop, the obtained compensation phase difference can be ensured to be more accurate, and is not to be stored, so that storage resources of the chip are saved; the phase compensation is performed on the second reference clock according to the compensation phase difference to obtain the updated second reference clock, the updated second reference clock is an operating clock to be used by the digital phase locked loop after the clock being switched, a digital circuit is used for implementing a function of phase shifting of the clock, resulting in a simple implementation, the accuracy of the updated second reference clock can be ensured, and the first reference clock can be seamlessly switched to the updated second reference clock.

Figure 3:
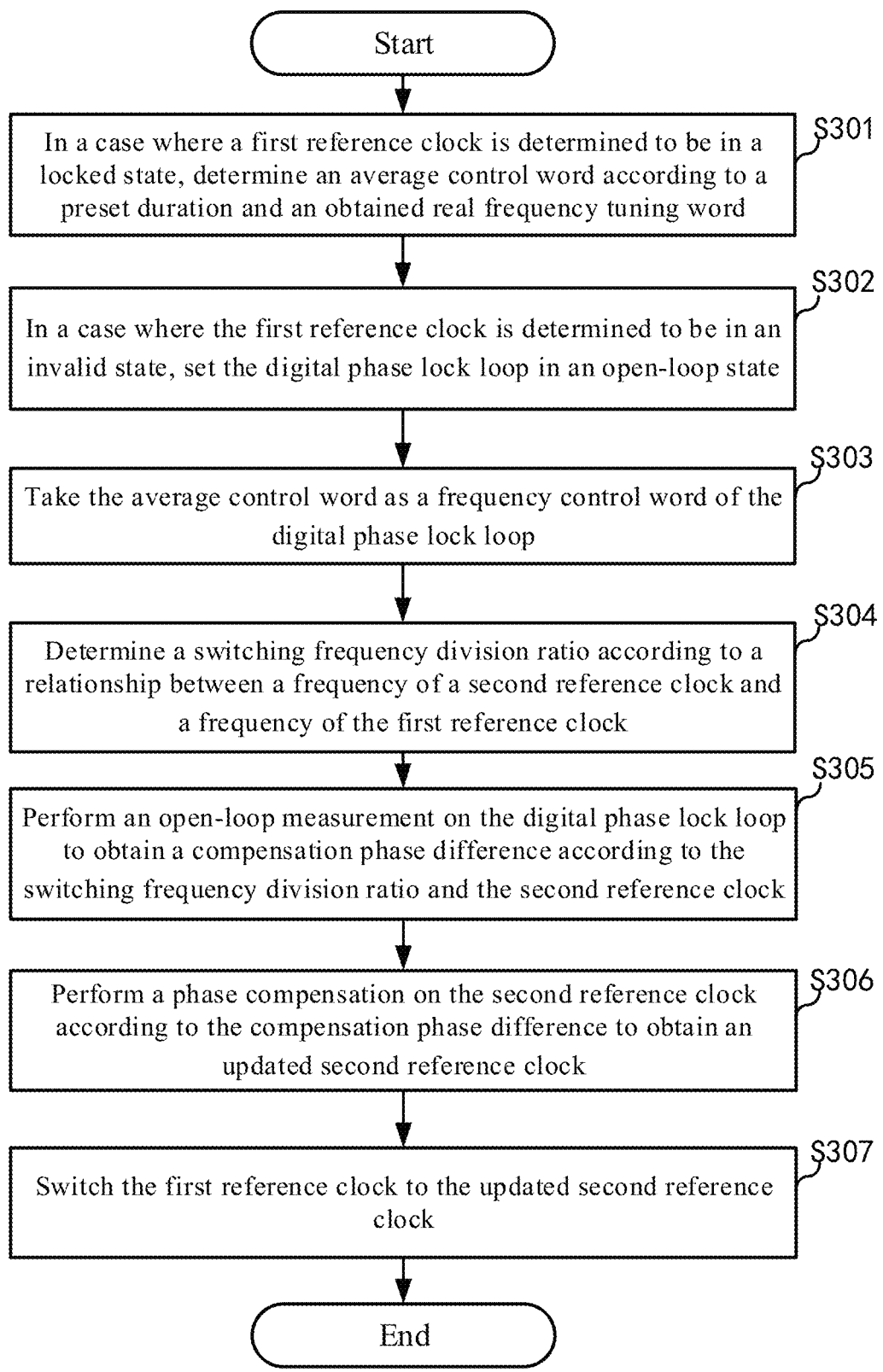
FIG. 3 illustrates a flowchart of a clock switching method according to the present application.

FIG. 3 illustrates a flowchart of a clock switching method according to the present application. The clock switching method may be applied to a clock switching apparatus arranged in a digital phase locked loop for seamlessly switching a reference clock. As shown in FIG. 3, the clock switching method provided in the present application may include following operations S301 to S307.

At operation S301, in a case where a first reference clock is determined to be in a locked state, determining an average control word according to a preset duration and an obtained real frequency tuning word.

The operation S301 shown in FIG. 3 is the same as the operation S201 described above, and thus is not repeatedly detailed herein.

At operation S302, in a case where the first reference clock is determined to be in an invalid state, setting the digital phase locked loop to be in an open-loop state.

It should be noted that, in the case where the first reference clock is determined to be in the invalid state, the clock output by the digital phase locked loop is wrong, in order to avoid a communication confusion caused by using a wrong operating clock in the communication system, the digital phase locked loop is set to be in the open-loop state, so that the first reference clock can be temporarily stopped in an operating state, the calculation of the average control word is stopped simultaneously, and operation S303 is to be executed to ensure that an output frequency of the digital oscillator is stable.

At operation S303, taking the average control word as a frequency control word of the digital phase locked loop.

The frequency control word of the digital phase locked loop is used for controlling the digital phase locked loop to output different clock frequencies.

The average control word is used as the frequency control word of the digital phase locked loop, so that different reference clocks can be synchronized to the same starting point, which facilitates further calculating the frequency of each reference clock, the damped oscillation of frequency period of the reference clock in the adjustment process of adjusting the reference clock can be reduced, thereby reducing the jitter of the output clock.

At operation S304, determining a switching frequency division ratio according to a relationship between a frequency of a second reference clock and a frequency of the first reference clock.

The frequency of the second reference clock may be the same as or different from the frequency of the first reference clock (for example, the frequency of the second reference clock is an integer multiple or integer times of the frequency of the first reference clock), in a case where the output frequency is desired not to be changed, the switching frequency division ratio is in inverse proportion to the frequency of the reference clock, so that the adjustment of the clock is easier to be realized, and the power loss can be reduced.

At operation S305, performing an open-loop measurement on the digital phase locked loop to obtain a compensation phase difference according to the switching frequency division ratio and the second reference clock.

The second reference clock is a reference clock newly accessed, however, since a difference exists between the second reference clock and the first reference clock (for example, there is a phase difference between the two clocks, or the frequencies of the two clocks are different), the open-loop measurement is performed on the digital phase locked loop to obtain the compensation phase difference according to the switching frequency division ratio and the second reference clock, the compensation phase difference is used to compensate the second reference clock, so that the compensated/updated second reference clock is more suitable for the communication system.

At operation S306, performing a phase compensation on the second reference clock according to the compensation phase difference to obtain the updated second reference clock.

At operation S307, switching the first reference clock to the updated second reference clock.

It should be noted that operations S306 and S307 shown in FIG. 3 are the same as operations S203 and S204, respectively, and thus are not repeatedly detailed herein.

In the present application, by setting the digital phase locked loop to be in the open-loop state in the case where the first reference clock is determined to be in the invalid state, the first reference clock can be temporarily stopped in the operating state, thereby avoiding a communication confusion caused by using a wrong operating clock in the communication system; the average control word is used as the frequency control word of the digital phase locked loop, and the damped oscillation of frequency period of the reference clock in the adjustment process of adjusting the reference clock can be reduced, thereby reducing the jitter of the reference clock; the switching frequency division ratio is determined according to the relationship between the frequency of the second reference clock and the frequency of the first reference clock, so that the adjustment of the clock is easier to be realized, and the power loss can be reduced; and the open-loop measurement is performed on the digital phase locked loop according to the switching frequency division ratio and the second reference clock to obtain the compensation phase difference, the phase compensation is performed on the second reference clock by using the compensation phase difference to obtain the updated second reference clock, so that the accuracy of the updated second reference clock can be ensured, and the first reference clock can be seamlessly switched to the updated second reference clock.

In some implementations, the performing an open-loop measurement on the digital phase locked loop to obtain a compensation phase difference according to the switching frequency division ratio and the second reference clock includes: performing a frequency division on the second reference clock according to the switching frequency division ratio to obtain a feedback clock of a loop to be switched; performing phase synchronization and processing on the second reference clock and the feedback clock of the loop to be switched to obtain a reference phase difference; acquiring a loop phase error, corresponding to the first reference clock, indicating a phase difference between the first reference clock and a feedback clock corresponding to the digital phase locked loop before clock switching (i.e., before the clock thereof being switched); and determining the compensation phase difference according to the loop phase error and the reference phase difference.

The feedback clock of the loop to be switched is a feedback clock, in the loop, determined after the second reference clock accesses the digital phase locked loop.

The reference phase difference can be acquired by performing phase synchronization on the second reference clock and the feedback clock of the loop to be switched, and calculating a difference between the second reference clock and the feedback clock of the loop to be switched. The reference phase difference can reflect a degree of influence of the second reference clock on a phase in the digital phase locked loop; and the loop phase error corresponding to the first reference clock is the phase difference between the first reference clock and the feedback clock corresponding to the digital phase locked loop before clock switching, and can reflect a degree of influence of the first reference clock on the phase in the digital phase locked loop, and a difference between the first reference clock and the second reference clock can be comprehensively determined according to the loop phase error and the reference phase difference, i.e., if the first reference clock is switched to the second reference clock, what a difference value (for example, the compensation phase difference) expected to be compensated to ensure that the first reference clock can be seamlessly switched to the updated second reference clock is determined, thereby avoiding the jitter of the output clock, and reducing the degree of influence on the communication system.

In some implementations, the determining the compensation phase difference according to the loop phase error and the reference phase difference includes: in a case where the reference phase difference is determined to be stable, performing an operation of calculating a difference value on the reference phase difference and the loop phase error to obtain the compensation phase difference.

It should be noted that a calculation of the reference phase difference is expected to be stabilized for a period of time, so that the stabilized reference phase difference can accurately reflect the degree of influence of the second reference clock on the phase in the digital phase locked loop, and the accuracy of the difference between the reference phase difference and the loop phase error can ensured, thereby ensuring the accuracy of the compensation phase difference.

In some implementations, the determining a switching frequency division ratio according to a relationship between a frequency of a second reference clock and a frequency of the first reference clock includes: in a case where the frequency corresponding to the first reference clock is determined to be the same as the frequency corresponding to the second reference clock, determining the switching frequency division ratio according to the frequency corresponding to the second reference clock; and in a case where one of the frequency corresponding to the first reference clock and the frequency corresponding to the second reference clock is a multiple or times of the other of the frequency corresponding to the first reference clock and the frequency corresponding to the second reference clock, acquiring the multiple or the number of the times between the frequency corresponding to the first reference clock and the frequency corresponding to the second reference clock, and determining the switching frequency division ratio according to the multiple or the number of the times, and the frequency corresponding to the second reference clock.

In the case where the frequency corresponding to the first reference clock is determined to be the same as the frequency corresponding to the second reference clock, the switching frequency division ratio can be determined according to actual test expectations and the frequency corresponding to the second reference clock. For example, if the frequency corresponding to the second reference clock is 10 MHz, and in a simulation process, in order to lock the frequency of the output clock of the digital phase locked loop at 8.0125 GHz, the switching frequency division ratio may be set to be equal to 8.0125 GHz/10 MHz=801.25, i.e., an integer frequency division ratio is set to 801, and a fractional frequency division ratio is 0.25, so as to ensure that the effect of the simulation better meets actual expectations.

In the case where one of the frequency corresponding to the first reference clock and the frequency corresponding to the second reference clock is a multiple or times of the other of the frequency corresponding to the first reference clock and the frequency corresponding to the second reference clock, for example, the frequency of the first reference clock is 10 MHz, the frequency of the second reference clock is 20 MHz, since the frequency of the second reference clock is two times of the frequency of the first reference clock, in order to lock the frequency of the output clock of the digital phase locked loop at 8.0125 GHz, the switching frequency division ratio may be set to be equal to 8.0125 GHz/20 MHz=400.625, i.e., the integer frequency division ratio is set to 400, and the fractional frequency division ratio is 0.625, so as to ensure that the effect of the simulation better meets the actual expectations.

In some implementations, the clock switching method provided in the present application further includes: before performing the phase compensation on the second reference clock according to the compensation phase difference to obtain the updated second reference clock, acquiring a system clock; and determining a phase corresponding to the second reference clock according to a rising edge of the second reference clock and the system clock.

The system clock may be a high-precision and high-frequency output clock provided by another analog phase locked loop.

For example, a phase value corresponding to a certain rising edge of the second reference clock is obtained, then the system clock is de-reset (for example, the system clock is cleared and zeroed) to obtain a phase value at a starting point of the system clock that is de-reset, and then a difference between the phase value corresponding to the certain rising edge of the second reference clock and the phase value at the starting point of the system clock that is de-reset is calculated, and a phase of the second reference clock with respect to the system clock, i.e., a phase value corresponding to the second reference clock, can be accurately obtained.

According to the rising edge of the second reference clock and the system clock, the accuracy of the obtained phase value corresponding to the second reference clock can be ensured, and a difference between phases of different reference clocks is avoided.

In some implementations, the performing a phase compensation on a second reference clock according to the compensation phase difference to obtain the updated second reference clock includes: performing an operation of calculating a difference on the phase corresponding to the second reference clock and the compensation phase difference to determine the updated second reference clock.

By performing the operation of calculating the difference on the phase corresponding to the second reference clock and the compensation phase difference, a phase difference, to be adjusted, of the second reference clock can be obtained, so that the updated second reference clock is more accurate and is more suitable for the communication system.

In some implementations, the clock switching method provided in the present application further includes: before determining the average control word according to the preset duration and the obtained real frequency tuning word in the case where the first reference clock is determined to be in the locked state, detecting the first reference clock to obtain a detection result including a period of the first reference clock; and determining a state of the first reference clock according to the period of the first reference clock and a preset period threshold, the state of the first reference clock including a valid state or an invalid state.

The detecting on the reference clock is according to the system clock, a frequency of the system clock is higher than the frequency of the reference clock (for example, the frequency of the system clock is 10 times the frequency of the reference clock, or the like), the reference clock is counted in one or more periods of the reference clock to obtain a counted value, and if the counted value is within a range of a preset threshold (for example, the preset period threshold), the reference clock is considered to be in the valid state; if the counted value is not within the range of the preset threshold (for example, the preset period threshold), the reference clock is considered to be in the invalid state. The preset period threshold may be a range of counting, e.g., counting from 1 to 10, or the like.

By detecting the period of the first reference clock, the state of the first reference clock can be determined, and if a problem occurs in the first reference clock, processing such as switching the reference clock can be ensured to be performed in time, so as to ensure effectiveness of the operating clock of the communication system.

In some implementations, the clock switching method provided in the present application further includes: after determining the state of the first reference clock according to the period of the first reference clock and the preset period threshold, in the case where the first reference clock is determined to be in the valid state, detecting whether the first reference clock is in the locked state.

In the case where the first reference clock is determined to be in the valid state, whether the first reference clock is in the locked state is further to be detected, in a case where the first reference clock is determined to be in the locked state, it indicates that the first reference clock is used as the operating clock of the communication system; in a case where the first reference clock is determined to be in an unlocked state, it indicates that the first reference clock is not used as the operating clock of the communication system.

By further detecting the first reference clock, whether the first reference clock is in the locked state is determined to determine whether the first reference clock is used as the operating clock of the communication system, so as to determine a current state of the first reference clock, and facilitate a subsequent processing for the first reference clock.

In some implementations, the detecting whether the first reference clock is in the locked state includes: performing phase synchronization and processing on the first reference clock and a feedback clock corresponding to the digital phase locked loop before clock switching to obtain a loop phase error corresponding to the first reference clock; acquiring a hop speed of the loop phase error corresponding to the first reference clock; and in a case where the hop speed of the loop phase error is determined to be within a range of a preset speed threshold, determining that the first reference clock is in the locked state; in a case where the hop speed of the loop phase error is determined to be not within the range of the preset speed threshold, determining that the first reference clock is in the unlocked state.

The hop speed of the loop phase error can reflect a condition of an oscillation in the loop. In a case where the oscillation in the loop is determined to tend to be stable, i.e., the hop speed of the loop phase error is within the range of the preset speed threshold (e.g., a hop amplitude in each clock period, for example, 0.001 degree in each clock period), the first reference clock is determined to be in the locked state.

The condition of the oscillation in the loop is reflected by detecting whether the hop speed of the loop phase error is within the range of the preset speed threshold, thereby determining whether the first reference clock is in the locked state and facilitating a subsequent processing for the first reference clock.

In some implementations, the clock switching method provided in the present application further includes: after switching the first reference clock to the updated second reference clock, setting the digital phase locked loop in a closed-loop state; and taking the real frequency tuning word as the frequency control word of the digital phase locked loop.

After the first reference clock is switched to the updated second reference clock, the digital phase locked loop is further set to the closed-loop state, so that the updated second reference clock is output as the operating clock of the communication system, and the normal operating of the communication system is ensured. Moreover, the real frequency tuning word is used as the frequency control word of the digital phase locked loop, so that the updated second reference clock can be conveniently processed during the clock being switched next time, the digital phase locked loop can work circularly, the operating clock of the communication system can be automatically detected and switched, the effectiveness of the operating clock of the communication system is ensured, and the operating efficiency of the communication system is improved.

In some implementations, the clock switching method provided in the present application further includes: before determining the average control word according to the preset duration and the obtained real frequency tuning word in the case where the first reference clock is determined to be in the locked state, acquiring a plurality of reference clocks and priorities thereof; and screening the plurality of reference clocks according to the priority of the reference clocks to obtain the first reference clock, a priority of the first reference clock is higher than the priorities of other reference clocks.

The digital phase locked loop can simultaneously acquire a plurality of reference clocks, but does not process each reference clock, the reference clocks are sequenced according to the priorities of the reference clocks, the reference clock with the highest priority is selected as the first reference clock, and the reference clock with the highest priority is guaranteed to be processed first, so that the effectiveness of the reference clock is guaranteed.

Figure 4:
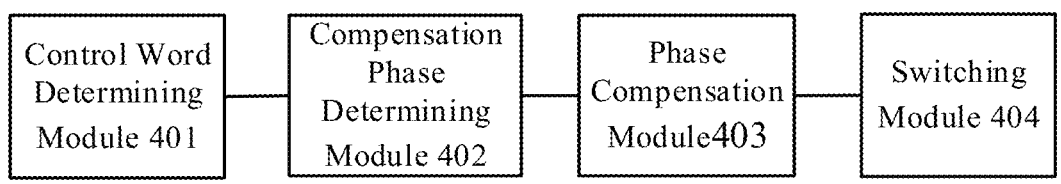
FIG. 4 illustrates a structural schematic diagram of a clock switching apparatus according to the present application.

A clock switching apparatus provided in the present application is described in detail below with reference to the accompanying drawings. FIG. 4 illustrates a structural schematic diagram of a clock switching apparatus according to the present application. As shown in FIG. 4, the clock switching apparatus may include a control word determining module 401, a compensation phase determining module 402, a phase compensation module 403, and a switching module 404.

The control word determining module 401 is configured to determine an average control word according to a preset duration and an obtained real frequency tuning word in a case where a first reference clock is determined to be in a locked state; the compensation phase determining module 402 is configured to determine a compensation phase difference by using the average control word as a frequency control word of a digital phase locked loop in a case where the first reference clock is determined to be in an invalid state; the phase compensation module 403 is configured to perform a phase compensation on a second reference clock according to the compensation phase difference to obtain the updated second reference clock; the switching module 404 is configured to switch the first reference clock to the updated second reference clock.

In the present application, by the control word determining module 401 determining the average control word according to the preset duration and the obtained real frequency tuning word in the case where the first reference clock is determined to be in the locked state, the damped oscillation of frequency period of the reference clock in the adjustment process of adjusting the reference clock can be reduced, thereby reducing the jitter of the reference clock; in the case where the first reference clock is determined to be in the invalid state, the compensation phase determining module 402 determines the compensation phase difference by using the average control word as the frequency control word of the digital phase locked loop, the obtained compensation phase difference can be ensured to be more accurate, and is not to be stored, so that the storage resources of the chip are saved; the phase compensation module 403 performs the phase compensation on the second reference clock according to the compensation phase difference to obtain the updated second reference clock, the updated second reference clock is an operating clock to be used by the digital phase locked loop after the clock being switched, a digital circuit is used for implementing a function of phase shifting of the clock, resulting in a simple implementation, the accuracy of the updated second reference clock can be ensured, and the switching module 404 can seamlessly switches the first reference clock to the updated second reference clock.

Figure 5:
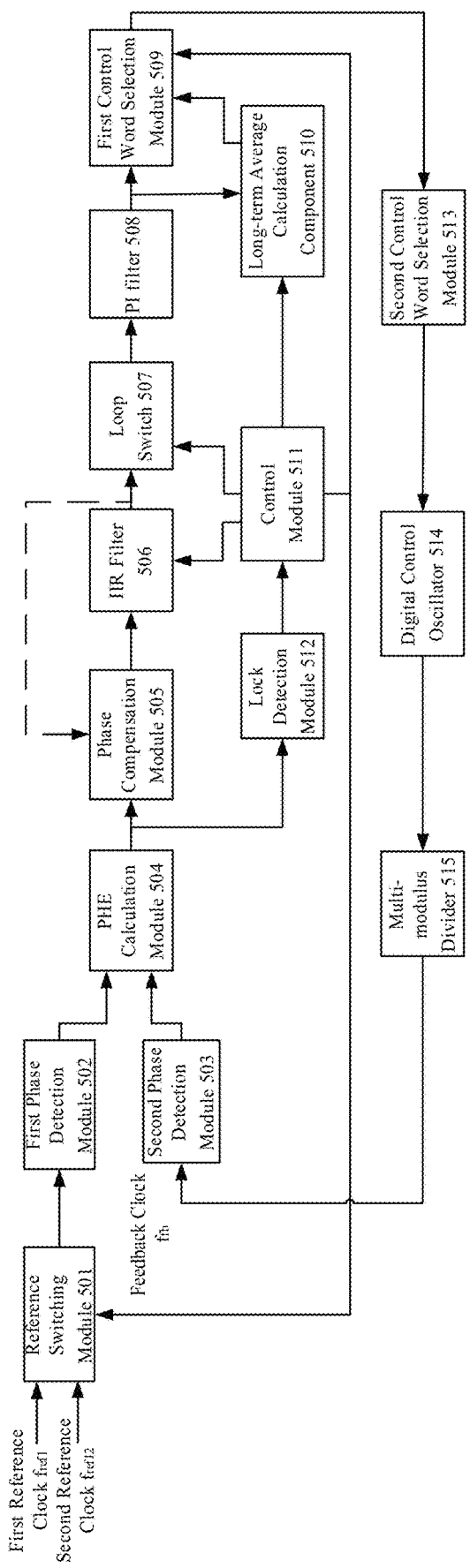
FIG. 5 illustrates a structural schematic diagram of a digital phase locked loop for seamlessly switching a reference clock according to the present application.

FIG. 5 illustrates a structural schematic diagram of a digital phase locked loop for seamlessly switching a reference clock according to the present application. As shown in FIG. 5, the digital phase locked loop for seamlessly switching the reference clock includes a reference switching module 501, a first phase detection module 502, a second phase detection module 503, a phase error (PHE) calculation module 504, a phase compensation module 505, an infinite impulse response (IIR) filter 506, a loop switch 507, a proportional-integral (PI) filter 508, a first control word selection module 509, a long-term average calculation component 510, a control module 511, a lock detection module 512, a second control word selection module 513, a digital control oscillator 514, and a multi-modulus divider 515.

The reference switching module 501 is configured to select one reference clock from two or more reference clocks input thereto to input the selected reference clock into the first phase detection module 502, and acquire a control signal from the control module 511.

The first phase detection module 502 is configured to measure a first output phase of the first reference clock $f_{ref1}$ with respect to the system clock fs; the second phase detection module 503 is configured to measure a second output phase of the feedback clock $f_{fb}$ with respect to the system clock fs.

The system clock may be a reference clock obtained from outside, for example, a high-precision and high-frequency output clock provided by another analog phase locked loop.

Figure 6:
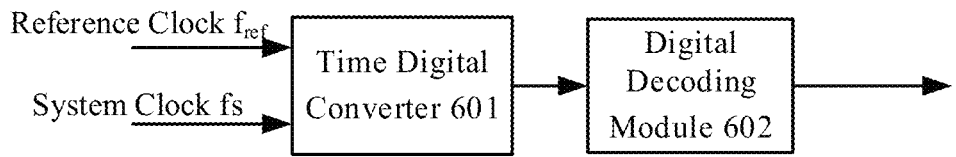
FIG. 6 illustrates a structural schematic diagram of a phase detection module of a digital phase locked loop for seamlessly switching a reference clock according to the present application.

FIG. 6 illustrates a structural schematic diagram of a phase detection module of a digital phase locked loop for seamlessly switching a reference clock according to the present application. As shown in FIG. 6, the first phase detection module 502 or the second phase detection module 503 each may include a time digital converter 601 and a digital decoding module 602.

The time digital converter 601 is configured to perform a time-to-digital conversion on an input reference clock or a system clock, i.e., the input time information is converted into digital information. The digital decoding module 602 is configured to perform a decoding operation on the digital information output from the time-to-digital converter 601.

For example, the digital decoding module 602 counts the digital information, corresponding to the system clock, output by the time digital converter 601 and calculates a phase of the rising edge of each reference clock with respect to a starting point of the system clock that is de-reset. The digital decoding module 602 may be further configured to calculate a phase of a rising edge of each feedback clock with respect to the starting point of the system clock that is de-reset. The de-reset is to clear the system clock to zero to avoid a confusion of system clocks at different times.

The PHE calculation module 504 is configured to perform phase synchronization on the first output phase of the first reference clock $f_{ref1}$ output by the first phase detection module 502 with respect to the system clock fs and on the second output phase of the feedback clock $f_{fb}$ output by the second phase detection module 503 with respect to the system clock fs, and perform an operation of calculating a difference on the first output phase and the second output phase to obtain a loop phase error corresponding to the first reference clock $f_{ref1}$. By synchronizing the first output phase and the second output phase, the loop phase error obtained can be ensured to be more accurate.

In the case where the first reference clock $f_{ref1}$ is determined to be in an invalid state, the digital phase locked loop is in an open-loop state, a feedback clock input into the second phase detection module 503 is a feedback clock corresponding to the digital phase locked loop before clock switching, and the loop phase error corresponding to the first reference clock $f_{ref1}$ is the phase difference between the first reference clock $f_{ref1}$ and the feedback clock corresponding to the digital phase locked loop before clock switching.

It should be noted that, since the first output phase output by the first phase detection module 502 and the second output phase output by the second phase detection module 503 are phases calculated with respect to the system clock fs, a difference between the first output phase and the second output phase is the phase difference between the first reference clock $f_{ref1}$ and the feedback clock corresponding to the digital phase locked loop before clock switching.

The phase compensation module 505 is configured to perform a phase compensation on the second reference clock $f_{ref2}$ during the clock being seamlessly switched.

For example, after the clock being switched to the second reference clock $f_{ref2}$, through the multi-modulus divider 515, a frequency of the second reference clock $f_{ref2}$ is divided according to a switching frequency division ratio to obtain a feedback clock of a loop to be switched; then, the feedback clock of the loop to be switched is output to the second phase detection module 503, so that the second phase detection module 503 performs phase synchronization and an operation of calculating a difference on the second reference clock $f_{ref2}$ and the feedback clock of the loop to be switched, i.e., a reference phase difference is obtained; then an operation of calculating a difference is performed on the reference phase difference and the loop phase error corresponding to the first reference clock to obtain a compensation phase difference, the phase compensation may be performed on the second reference clock $f_{ref2}$ by the compensation phase difference to ensure that the updated second reference clock is more accurate, so that the first reference clock $f_{ref1}$ can be seamlessly switched to the updated second reference clock.

The loop switch 507 is configured to open the loop in a case where the first reference clock $f_{ref1}$ is determined to be in the invalid state; in a case where the first reference clock $f_{ref1}$ is determined to be in a locked state, or in a case where the first reference clock $f_{ref1}$ is switched to the updated second reference clock and the updated second reference clock is in the locked state, the loop is to be closed.

In a case where the loop switch 507 is determined to be in a closed state or turned on, i.e., in a case where the digital phase locked loop is in a closed-loop state, a loop filter of the digital phase locked loop is obtained by cascading the IIR filter 506 and the PI filter 508.

The IIR filter 506 is configured to filter an input phase difference. The PI filter 508 is configured to adjust a loop bandwidth of the digital phase locked loop according to parameter configuration thereof.

In a case where the loop switch 507 is determined to be in an open state or turned off, i.e., in a case where the digital phase locked loop is in an open-loop state, the IIR filter 506 may further be reused as a filter for the phase difference, in this case, history data of the IIR filter 506 is to be cleared first and then the IIR filter 506 is restart to operate, thereby the phase difference output through the IIR filter 506 can be more accurate. Then, the phase difference output by the IIR filter 506 is input into the phase compensation module 505, so that the compensation phase difference calculated by the phase compensation module 505 is more accurate.

The first control word selection module 509 is configured to select an average control word output by the long-term average calculation component 510 as a real control word of the digital phase locked loop in the case where the first reference clock $f_{ref1}$ is determined to be in the invalid state; and select a real frequency tuning word as the real control word of the digital phase locked loop in the case where the first reference clock $f_{ref1}$ is determined to be in the locked state.

The long-term average calculation component 510 is configured to perform a long-term addition and an average operation on an acquired/obtained real frequency tuning word to obtain the average control word in the case where the first reference clock $f_{ref1}$ is determined to be in the locked state.

For example, a plurality of real frequency tuning words within a range of the preset duration (e.g., 10 seconds, 20 seconds, etc.) may be obtained; and the long-time addition and the average operation are performed on the plurality of real frequency tuning words according to the preset duration to obtain the average control word, the stability of the average control word is proportional to the preset duration, i.e., the longer the preset duration is, the more stable the obtained average control word is. The average control word may be a real control word between the first reference clock $f_{ref1}$ in the valid state and the first reference clock $f_{ref1}$ in the locked state, i.e., a real control word of the digital phase locked loop in a state of waiting for switching.

The control module 511 is configured to, through a state machine, control a state of the reference clock being seamlessly switched, for selecting an appropriate reference clock; the control module 511 is further configured to control the loop switch 507, and in the case where the first reference clock $f_{ref1}$ is determined to be in the invalid state, control the loop switch 507 to open the loop; in the case where the first reference clock $f_{ref1}$ is determined to be in the locked state, or, the first reference clock $f_{ref1}$ is switched to the updated second reference clock and the updated second reference clock is in the locked state, control the loop switch 507 to close the loop. The control module 511 is further configured to control the first control word selection module 509 for selecting the appropriate control word for the digital phase locked loop. The lock detection module 512 is configured to obtain a hop speed of the loop phase error corresponding to the first reference clock $f_{ref1}$; and determine the first reference clock $f_{ref1}$ is in the locked state in a case where the hop speed of the loop phase error is within a range of a preset speed threshold (e.g., a hop amplitude in each clock period, for example, 0.001 degree in each clock period); determine the first reference clock $f_{ref1}$ is in the unlocked state in a case where the hop speed of the loop phase error is determined to be not within the range of the preset speed threshold.

The multi-modulus divider 515 is configured to divide the frequency of the output clock to obtain the feedback clock. In a case where the frequency of the second reference clock $f_{ref2}$ is determined to be an integer multiple or integer times of the frequency of the first reference clock $f_{ref1}$, a frequency division ratio of the multi-modulus divider 515 is to be correspondingly switched.

For example, the multiple or the number of the times between the frequency corresponding to the first reference clock $f_{ref1}$ and the frequency corresponding to the second reference clock $f_{ref2}$ is obtained (for example, the frequency corresponding to the second reference clock $f_{ref2}$ may be two times of the frequency corresponding to the first reference clock $f_{ref1}$), the switching frequency division ratio of the multi-modulus divider 515 is determined according to the multiple or the number of the times, and the frequency corresponding to the second reference clock $f_{ref2}$.

The lock detection module 512 is configured to output an identifier indicating whether the first reference clock $f_{ref1}$ is in the locked state to the state machine in the control module 511 to facilitate a state migration of the digital phase locked loop by the control module 511.

Through the digital phase locked loop for seamlessly switching the reference clock in the present application, during the reference clock being seamlessly switched, in the case where the first reference clock is determined to be in the locked state, the long-term average operation is performed on the real frequency tuning words within the range of the preset duration to obtain the average control word, the damped oscillation of frequency period of the reference clock in an adjustment process of adjusting the reference clock can be reduced, thereby reducing the jitter of the reference clock and achieving a good stability; in the case where the first reference clock is determined to be in the invalid state, the average operation performed on the real frequency tuning words is stopped, the loop is opened, the obtained average control word is taken as the frequency control word of the digital phase locked loop, and then according to the switching frequency division ratio determined by the multi-modulus divider 515, the second reference clock $f_{ref2}$ is divided to obtain the feedback clock of the loop to be switched, and the compensation phase difference is further obtained according to the feedback clock and the first reference clock $f_{ref1}$ to make the compensation phase difference to be more accurate, so that storage resources of the chip are saved and no external CPU is to be depended on; the phase compensation is performed on the second reference clock $f_{ref2}$ according to the compensation phase difference to obtain the updated second reference clock which serves as the operating clock to be used by the digital phase locked loop after the clock being switched, so that the digital phase locked loop is in a stable state again. Since the digital phase locked loop, which is fully digital, is adopted for seamlessly switching the clock, operations of calculating and storing simultaneously performed on the phases of two reference clocks are avoided, resulting in a simple implementation, the accuracy of the updated second reference clock can be ensured, and the first reference clock can be seamlessly switched to the updated second reference clock.

Figure 7:
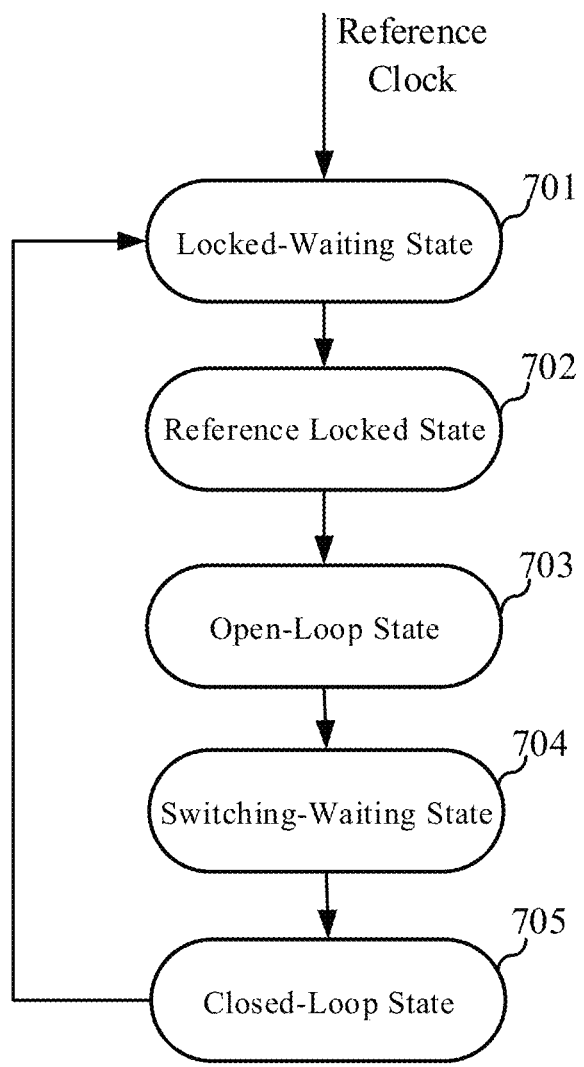
FIG. 7 illustrates a schematic diagram of a state migration of a control module for seamlessly switching a reference clock according to the present application.

FIG. 7 illustrates a schematic diagram of a state migration of a control module for seamlessly switching a reference clock according to the present application. As shown in FIG. 7, the state machine of the control module 511 includes a locked-waiting state 701, a reference locked state 702, an open-loop state 703, a switching-waiting state 704, and a closed-loop state 705.

The control module 511 first selects from the reference clocks according to priorities of the reference clocks input thereto to obtain the reference clock with the highest priority (e.g., the first reference clock $f_{ref1}$), then the first reference clock $f_{ref1}$, i.e., the reference clock with the highest priority, is input into the digital phase locked loop, and in this case, the digital phase locked loop is in the locked-waiting state 701, i.e., the first reference clock $f_{ref1}$ is waiting to be locked.

In the case where the first reference clock $f_{ref1}$ is determined to be in the locked state, the digital phase locked loop enters the reference locked state 702. In this case, the control module 511 controls the loop switch 507 to be in a closed state or turned on, and the long-time addition and the average operation are performed on the obtained real frequency tuning word through the long-term average calculation component 510, so as to obtain the average control word.

In the case where the first reference clock $f_{ref1}$ is determined to be in the invalid state, the digital phase locked loop enters the open-loop state 703. In this case, the control module 511 controls the loop switch 507 to be in an open state or turned off, an operation of the long-term average calculation component 510 is stopped, and the first control word selection module 509 is enabled, so that the first control word selection module 509 selects the average control word output by the long-term average calculation component 510 as the frequency control word of the digital phase locked loop.

After the digital phase locked loop enters the open-loop state 703, the control module 511 controls the IIR filter 506 to clear history data in the IIR filter 506, and causes the digital phase locked loop to enter the switching-waiting state 704. In a case where the digital phase locked loop enters the switching-waiting state 704, the digital phase locked loop waits for a preset duration (e.g., the preset duration may be configured to be 500 ns, etc.), so as to ensure the loop phase error corresponding to the first reference clock $f_{ref1}$ output by the IIR filter 506 to be more accurate. Then, the loop phase error corresponding to the first reference clock $f_{ref1}$ output by the IIR filter 506 is output to the phase compensation module 505, so that the phase compensation module 505 calculates the compensation phase difference, and performs the phase compensation on the second reference clock $f_{ref2}$ by using the compensation phase difference, thereby obtaining the updated second reference clock.

The control module 511 switches the reference clock of the digital phase locked loop from the first reference clock $f_{ref1}$ to the updated second reference clock, so that the updated second reference clock is in the locked state, and the digital phase locked loop enters the closed-loop state 705.

In the case where the second reference clock $f_{ref2}$ is in the locked state, the history data in the IIR filter 506 is to be cleared again and the loop switch 507 is controlled to be in the closed state or turned on, and the control word of the digital phase locked loop is switched to the real frequency tuning word and the digital phase locked loop re-enters the locked-waiting state 701.

In the present application, the state machine of the control module 511 controls the digital phase locked loop to be in different states, so that the modules of the digital phase locked loop can operate in cooperation with each other, and the obtained compensation phase difference is ensured to be more accurate; and in the case where the first reference clock $f_{ref1}$ is determined to be in the invalid state, the first reference clock $f_{ref1}$ can be automatically switched to the updated second reference clock, so that the reference clock in the digital phase locked loop is locked again, a stable output of the reference clock is ensured, and no external CPU is to be depended on.

Figure 8:
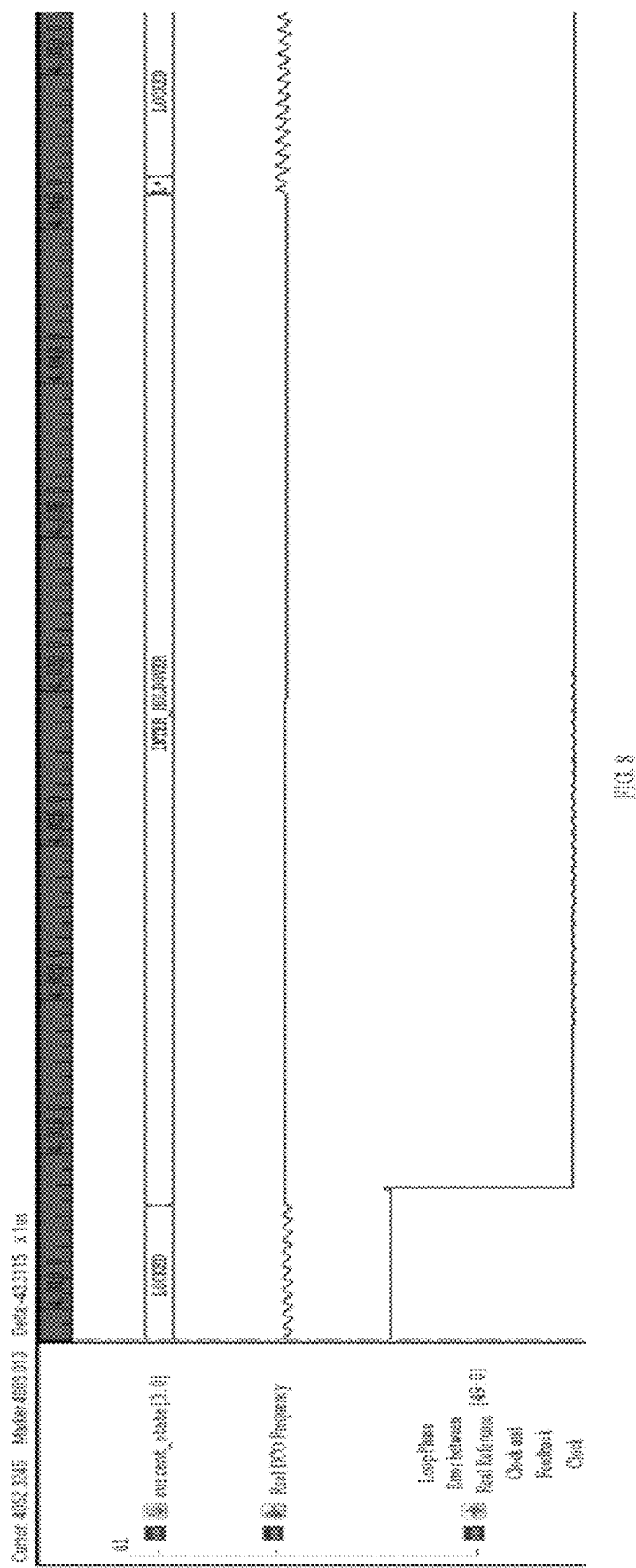
FIG. 8 illustrates a diagram of effect of seamless switching between reference clocks at the same frequency according to the present application.

FIG. 8 illustrates a diagram of effect of seamless switching between reference clocks at the same frequency according to the present application. Based on the digital phase locked loop for seamlessly switching the reference clock as shown in FIG. 5, assuming that the frequency of the first reference clock $f_{ref1}$ is 10 MHz, the frequency of the second reference clock $f_{ref2}$ is 10 MHz, an integer frequency division ratio is set to be equal to 801, and a fractional frequency division ratio is set to be equal to 0.25, i.e., a frequency of an output clock of the digital phase locked loop for seamlessly switching the reference clock may be locked to 801.25*10 MHz=8.0125 GHz.

As shown in FIG. 8, in a case where a current state of the digital phase locked loop for seamlessly switching the reference clock is determined to be in the locked state, a waveform output by the digital phase locked loop oscillates in a relatively small amplitude; by using the average control word as the frequency control word of the digital phase locked loop in a process of switching the clock, the waveform output by the digital phase locked loop is substantially stabilized at about 8.0125 GHz without oscillations, even in a case where the first reference clock $f_{ref1}$ is determined to be in the locked state, a phase difference corresponding to the first reference clock $f_{ref1}$ fluctuates around 0 degree, and after the first reference clock $f_{ref1}$ is switched to the updated second reference clock corresponding to the second reference clock $f_{ref2}$, the digital phase locked loop enters the switching-waiting state, in this case, a duration (for example, 568 ns and the like) is expected to be waited to ensure that the loop phase error corresponding to the first reference clock $f_{ref1}$ output by the IIR filter 506 is more accurate, so that the compensation phase difference obtained is more accurate, and the compensation phase difference is used for performing the phase compensation on the second reference clock $f_{ref2}$ to obtain the updated second reference clock; in a case where the updated second reference clock is determined to be in the locked state, the phase difference between the updated second reference clock in the locked state and the first reference clock $f_{ref1}$ is kept to be 180 degrees.

In the present application, by switching between the first reference clock and the second reference clock at the same frequency, the compensation phase difference can be accurately calculated, so that the first reference clock can be seamlessly switched to the second reference clock, and the damped oscillation of frequency period of the reference clock in the adjustment process of adjusting the reference clock is reduced, thereby reducing the jitter of the reference clock.

Figure 9:
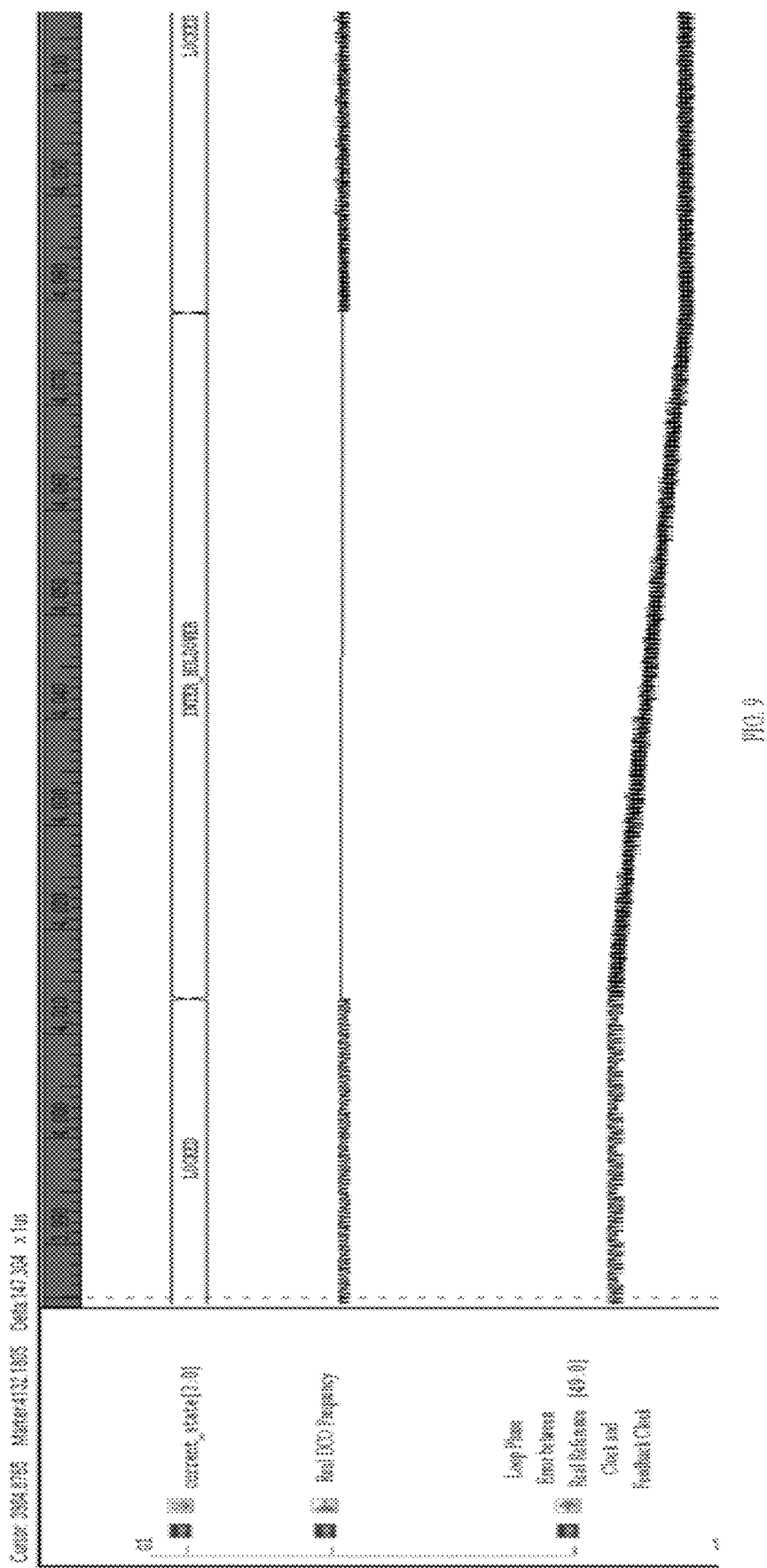
FIG. 9 illustrates a diagram of effect of seamless switching between reference clocks at multiplied frequencies according to the present application.

FIG. 9 illustrates a diagram of effect of seamless switching between reference clocks at multiplied frequencies according to the present application. Based on the digital phase locked loop for seamlessly switching the reference clock as shown in FIG. 5, assuming that the frequency of the first reference clock $f_{ref1}$ is 10 MHz, the frequency of the second reference clock $f_{ref2}$ is 20 MHz, since the frequency of the second reference clock $f_{ref2}$ is two times of the first reference clock $f_{ref1}$, based on a preset frequency division ratio of 801.25, a current frequency division ratio is set to be equal to 801.25/2=400.625, similarly, a frequency of an output clock of the digital phase locked loop for seamlessly switching the reference clock may be set to 400.625*20 MHz=8.0125 GHz.

As shown in FIG. 9, in a case where a current state of the digital phase locked loop for seamlessly switching the reference clock is determined to be in the locked state, a waveform output by the digital phase locked loop oscillates in a relatively small amplitude; by using the average control word as the frequency control word of the digital phase locked loop in a process of switching the clock, the waveform output by the digital phase locked loop is substantially stabilized at 8.0125 GHz without oscillations, even in a relatively small amplitude, in a case where the first reference clock $f_{ref1}$ is determined to be in the locked state, a loop phase difference corresponding to the first reference clock $f_{ref1}$ fluctuates around 1 degree, and after the first reference clock $f_{ref1}$ is switched to the updated second reference clock corresponding to the second reference clock $f_{ref2}$, a loop phase difference corresponding to the second reference clock $f_{ref2}$ fluctuates around −1 degree, the digital phase locked loop enters the switching-waiting state, in this case, a duration (for example, 8 μs and the like) is expected to be waited to ensure that the loop phase error corresponding to the first reference clock $f_{ref1}$ output by the IIR filter 506 is more accurate, so that the compensation phase difference (e.g., 2 degrees) obtained is more accurate, and the compensation phase difference is used for performing the phase compensation on the second reference clock $f_{ref2}$ to obtain the updated second reference clock; in a case where the updated second reference clock is determined to be in the locked state, the phase difference between the updated second reference clock in the locked state and the first reference clock $f_{ref1}$ is kept to be 2 degrees.

In the present application, by switching between the first reference clock and the second reference clock with the frequency being a multiple or times of the frequency of the first reference clock, the compensation phase difference can be accurately calculated, so that the first reference clock can be seamlessly switched to the second reference clock, and the damped oscillation of frequency period of the reference clock in the adjustment process of adjusting the reference clock is reduced, thereby reducing the jitter of the reference clock.

It should be understood that the present application is not limited to specific configurations and processes described above and illustrated in the accompanying drawings. For convenience and simplicity of description, detailed description of known methods is omitted in the present application, and specific operation processes of the system, the module and the component described above may refer to corresponding processes of the above method, and thus are not repeatedly detailed here.

Figure 10:
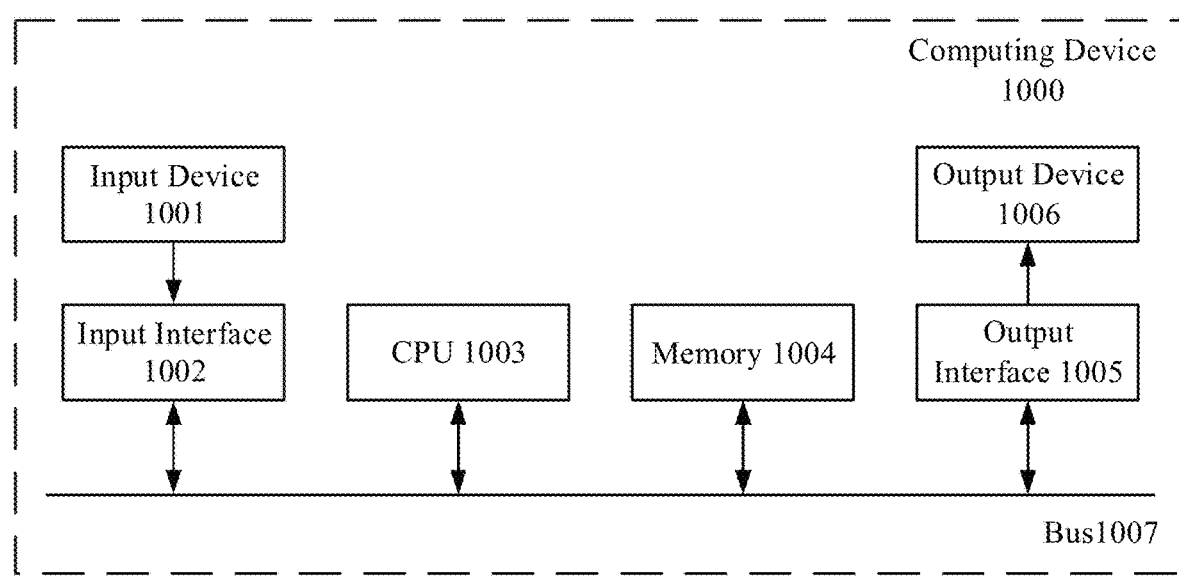
FIG. 10 is a schematic diagram of exemplary hardware architecture of a computing device for implementing a clock switching method or a clock switching apparatus according to the present application.

FIG. 10 is a schematic diagram of exemplary hardware architecture of a computing device for implementing a clock switching method or a clock switching apparatus according to the present application.

As shown in FIG. 10, the computing device 1000 includes an input device 1001, an input interface 1002, a central processing unit (CPU) 1003, a memory 1004, an output interface 1005, and an output device 1006. The input interface 1002, the CPU 1003, the memory 1004, and the output interface 1005 are connected via a bus 1007, and the input device 1001 and the output device 1006 are connected to the bus 1007, and are further connected to other components of the computing device 1000, via the input interface 1002 and the output interface 1005, respectively.

Specifically, the input device 1001 receives input information from outside and transmits the input information to the CPU 1003 through the input interface 1002; the CPU 1003 processes the input information based on computer-executable instructions stored in the memory 1004 to generate output information, temporarily or permanently stores the output information in the memory 1004, and then transmits the output information to the output device 1006 through the output interface 1005; the output device 1106 outputs the output information outside of the computing device 1000 for users.

In some implementations, the computing device shown in FIG. 10 may be implemented as an electronic device including: a memory configured to store a computer program; and a processor configured to execute the computer program stored in the memory to perform the clock switching method described above.

In some implementations, the computing device shown in FIG. 10 may be implemented as a clock switching system including: a memory configured to store a computer program; and a processor configured to execute the computer program stored in the memory to perform the clock switching method described above.

The present application further provides a computer-readable storage medium having a computer program stored thereon, the computer program, executed by a processor, causes the processor to perform the clock switching method described above.

The above description is only for exemplary embodiments of the present application, but is not intended to limit the scope of the present application. In general, the present application may be implemented in hardware or special purpose circuits, software, logic or any combination thereof. For example, some aspects may be implemented in hardware, while other aspects may be implemented in firmware or software which may be executed by a controller, a microprocessor or other computing devices, although the present application is not limited thereto.

The present application may be implemented by a data processor of a mobile device executing computer program instructions, for example, in a processor entity, or by hardware, or by a combination of software and hardware. The computer program instructions may be assembler instructions, instruction set architecture (ISA) instructions, machine instructions, machine-related instructions, microcode, firmware instructions, state setting data, or source or object code written in any combination of one or more programming languages.

The block diagram of any logical flowchart in the accompanying drawings of the present application may represent program operations; or may represent interconnected logic circuits, modules, and functions; or may represent a combination of program operations and logic circuits, modules, and functions. The computer program may be stored in the memory. The memory may be of any type suitable for the local technical environment and may be implemented by using any suitable data storage technology, such as, but is not limited to, a Random Access Memory (RAM), a Read-Only Memory (ROM), an optical storage device and system (a digital video disc (DVD) or a compact disc (CD)) and the like. The computer-readable medium may include a non-transitory storage medium. The data processor may be of any type suitable for the local technical environment, such as, but is not limited to, a general computer, a specific computer, a microprocessor, a digital signal processor (DSP), an application specific integrated circuit (ASIC), a field programmable gate array (FPGA), and a processor based on a multi-core processor architecture.

Through exemplary and non-limiting examples, a detailed description of the exemplary embodiments of the present application is provided above. Various modifications and adaptations to the above embodiments may be apparent to those skilled in the relevant art with reference to the accompanying drawings and the appended claims, without departing from the scope of the application. Accordingly, the proper scope of the present application is to be determined according to the claims.

What is claimed is:

1. A clock switching method, comprising:
   in a case where a first reference clock is determined to be in a locked state, determining an average control word according to a preset duration and an obtained real frequency tuning word;
   in a case where the first reference clock is determined to be in an invalid state, determining a compensation phase difference by using the average control word as a frequency control word of a digital phase locked loop;
   performing a phase compensation on a second reference clock according to the compensation phase difference to obtain an updated second reference clock; and
   switching the first reference clock to the updated second reference clock,
   wherein the determining an average control word according to a preset duration and an obtained real frequency tuning word comprises:
   acquiring a plurality of real frequency tuning words within a range of the preset duration; and
   performing a long-term average operation on the plurality of real frequency tuning words according to the preset duration to obtain the average control word, wherein a stability of the average control word is proportional to the preset duration.

2. The method of claim 1, wherein the determining a compensation phase difference by using the average control word as a frequency control word of a digital phase locked loop in a case where the first reference clock is determined to be in an invalid state comprises:
   in the case where the first reference clock is determined to be in the invalid state, setting the digital phase locked loop in an open-loop state;
   taking the average control word as the frequency control word of the digital phase locked loop;
   determining a switching frequency division ratio according to a relationship between a frequency of the second reference clock and a frequency of the first reference clock; and
   performing an open-loop measurement on the digital phase locked loop to obtain the compensation phase difference according to the switching frequency division ratio and the second reference clock.

3. The method of claim 2, wherein the performing an open-loop measurement on the digital phase locked loop to obtain the compensation phase difference according to the switching frequency division ratio and the second reference clock comprises:
   performing a frequency division on the second reference clock according to the switching frequency division ratio to obtain a feedback clock of a loop to be switched;
   performing phase synchronization and processing on the second reference clock and the feedback clock of the loop to be switched to obtain a reference phase difference;
   acquiring a loop phase error corresponding to the first reference clock, the loop phase error corresponding to the first reference clock being a phase difference between the first reference clock and a feedback clock corresponding to the digital phase locked loop before clock switching; and
   determining the compensation phase difference according to the loop phase error and the reference phase difference.

4. The method of claim 3, wherein the determining the compensation phase difference according to the loop phase error and the reference phase difference comprises:
   in a case where the reference phase difference is determined to be stable, performing an operation of calculating a difference on the reference phase difference and the loop phase error to obtain the compensation phase difference.

5. The method of claim 2, wherein the determining a switching frequency division ratio according to a relationship between a frequency of the second reference clock and a frequency of the first reference clock comprises:
   in a case where the frequency corresponding to the first reference clock is determined to be the same as the frequency corresponding to the second reference clock, determining the switching frequency division ratio according to the frequency corresponding to the second reference clock; or
   in a case where one of the frequency corresponding to the first reference clock and the frequency corresponding to the second reference clock is times of the other of the frequency corresponding to the first reference clock and the frequency corresponding to the second reference clock, acquiring the number of the times between the frequency corresponding to the first reference clock and the frequency corresponding to the second reference clock, and determining the switching frequency division ratio according to the number of the times and the frequency corresponding to the second reference clock.

6. The method of claim 1, further comprising:
before performing the phase compensation on the second reference clock according to the compensation phase difference to obtain the updated second reference clock, acquiring a system clock; and
determining a phase corresponding to the second reference clock according to a rising edge of the second reference clock and the system clock.

7. The method of claim 6, wherein the performing a phase compensation on a second reference clock according to the compensation phase difference to obtain an updated second reference clock comprises:
performing an operation of calculating a difference on the phase corresponding to the second reference clock and the compensation phase difference to determine the updated second reference clock.

8. The method of claim 1, further comprising:
before determining the average control word according to the preset duration and the obtained real frequency tuning word in the case where the first reference clock is determined to be in the locked state, detecting the first reference clock to obtain a detection result comprising a period of the first reference clock; and
determining a state of the first reference clock according to the period of the first reference clock and a preset period threshold, the state of the first reference clock comprising a valid state or an invalid state.

9. The method of claim 8, further comprising:
after determining the state of the first reference clock according to the period of the first reference clock and the preset period threshold, in a case where the first reference clock is determined to be in the valid state, detecting whether the first reference clock is in the locked state.

10. The method of claim 9, wherein the detecting whether the first reference clock is in the locked state comprises:
performing phase synchronization and processing on the first reference clock and a feedback clock corresponding to the digital phase locked loop before clock switching to obtain a loop phase error corresponding to the first reference clock;
acquiring a hop speed of the loop phase error corresponding to the first reference clock; and
in a case where the hop speed of the loop phase error is determined to be within a range of a preset speed threshold, determining that the first reference clock is in the locked state; in a case where the hop speed of the loop phase error is determined to be not within the range of the preset speed threshold, determining that the first reference clock is in an unlocked state.

11. The method of claim 1, further comprising:
after switching the first reference clock to the updated second reference clock, setting the digital phase locked loop in a closed-loop state; and
taking the real frequency tuning word as the frequency control word of the digital phase locked loop.

12. The method of claim 1, further comprising:
before determining the average control word according to the preset duration and the obtained real frequency tuning word in the case where the first reference clock is determined to be in the locked state, acquiring a plurality of reference clocks and priorities of the reference clocks; and
screening the plurality of reference clocks according to the priorities of the reference clocks to obtain the first reference clock, wherein the priority of the first reference clock is higher than the priorities of other reference clocks.

13. A clock switching apparatus, comprising:
a control word determining module configured to determine an average control word according to a preset duration and an obtained real frequency tuning word in a case where a first reference clock is determined to be in a locked state;
a compensation phase determining module configured to determine a compensation phase difference by using the average control word as a frequency control word of a digital phase locked loop in a case where the first reference clock is determined to be in an invalid state;
a phase compensation module configured to perform a phase compensation on a second reference clock according to the compensation phase difference to obtain an updated second reference clock; and
a switching module configured to switch the first reference clock to the updated second reference clock,
wherein the control word determining module is configured to acquire a plurality of real frequency tuning words within a range of the preset duration, and perform a long-term average operation on the plurality of real frequency tuning words according to the preset duration to obtain the average control word, wherein a stability of the average control word is proportional to the preset duration.

14. A non-transitory computer-readable storage medium having a computer program stored thereon, the computer program, executed by a processor, causes the processor to implement the clock switching method of claim 1.

15. A clock switching method, comprising:
in a case where a first reference clock is determined to be in a locked state, determining an average control word according to a preset duration and an obtained real frequency tuning word;
in a case where the first reference clock is determined to be in an invalid state, determining a compensation phase difference by using the average control word as a frequency control word of a digital phase locked loop;
performing a phase compensation on a second reference clock according to the compensation phase difference to obtain an updated second reference clock; and
switching the first reference clock to the updated second reference clock,
wherein the determining a compensation phase difference by using the average control word as a frequency control word of a digital phase locked loop in a case where the first reference clock is determined to be in an invalid state comprises:
in the case where the first reference clock is determined to be in the invalid state, setting the digital phase locked loop in an open-loop state;
taking the average control word as the frequency control word of the digital phase locked loop;
determining a switching frequency division ratio according to a relationship between a frequency of the second reference clock and a frequency of the first reference clock; and
performing an open-loop measurement on the digital phase locked loop to obtain the compensation phase difference according to the switching frequency division ratio and the second reference clock.

\* \* \* \* \*